United States Patent [19]

Nicholas et al.

[11] Patent Number: 4,502,015
[45] Date of Patent: Feb. 26, 1985

[54] DIODE DETECTOR WITH LINEARITY COMPENSATING CIRCUIT

[75] Inventors: John F. Nicholas, Liverpool; Edward A. Salvagni, Camillus, both of N.Y.

[73] Assignee: General Electric Company, Syracuse, N.Y.

[21] Appl. No.: 364,142

[22] Filed: Mar. 31, 1982

[51] Int. Cl.³ ............................................. H03D 1/10
[52] U.S. Cl. .................................... 329/166; 329/168; 329/204; 329/205 R; 329/206; 455/337
[58] Field of Search .................... 329/203, 204, 205 R, 329/206, 166, 168; 455/337; 307/350; 328/150

[56] References Cited

U.S. PATENT DOCUMENTS

| | | | |
|---|---|---|---|
| 3,264,571 | 8/1966 | Meindl et al. | 330/23 |
| 3,522,548 | 8/1970 | Heuner et al. | 330/23 |
| 3,681,623 | 8/1972 | Hoffman, Jr. et al. | 307/297 |
| 3,740,658 | 6/1973 | Loving | 330/22 |
| 3,939,433 | 2/1976 | Okada et al. | 330/25 |
| 3,980,963 | 9/1976 | Doi | 330/23 |

FOREIGN PATENT DOCUMENTS

| | | | |
|---|---|---|---|
| 974608 | 9/1975 | Canada | 307/350 |
| 1093162 | 1/1981 | Canada | 329/204 |
| 56-19209 | 2/1981 | Japan | 329/166 |

OTHER PUBLICATIONS

Schwerdt et al., "Build a Linear, High-Frequency Detector with Low Offset and Wide Dynamic Range", Electronic Design, vol. 23, No. 12, Jun. 7, 1975, p. 98.

Primary Examiner—Siegfried H. Grimm
Attorney, Agent, or Firm—Carl W. Baker; Richard V. Lang

[57] ABSTRACT

The detector circuit disclosed comprises a semiconductor diode bridge providing full wave output through an operational amplifier. The amplifier is enclosed within a feedback loop in which is interposed at least one diode matched to the detector diodes so as to enhance the linearity of operation of the detector-amplifier combination over a range of operating temperature and input signal levels.

4 Claims, 5 Drawing Figures

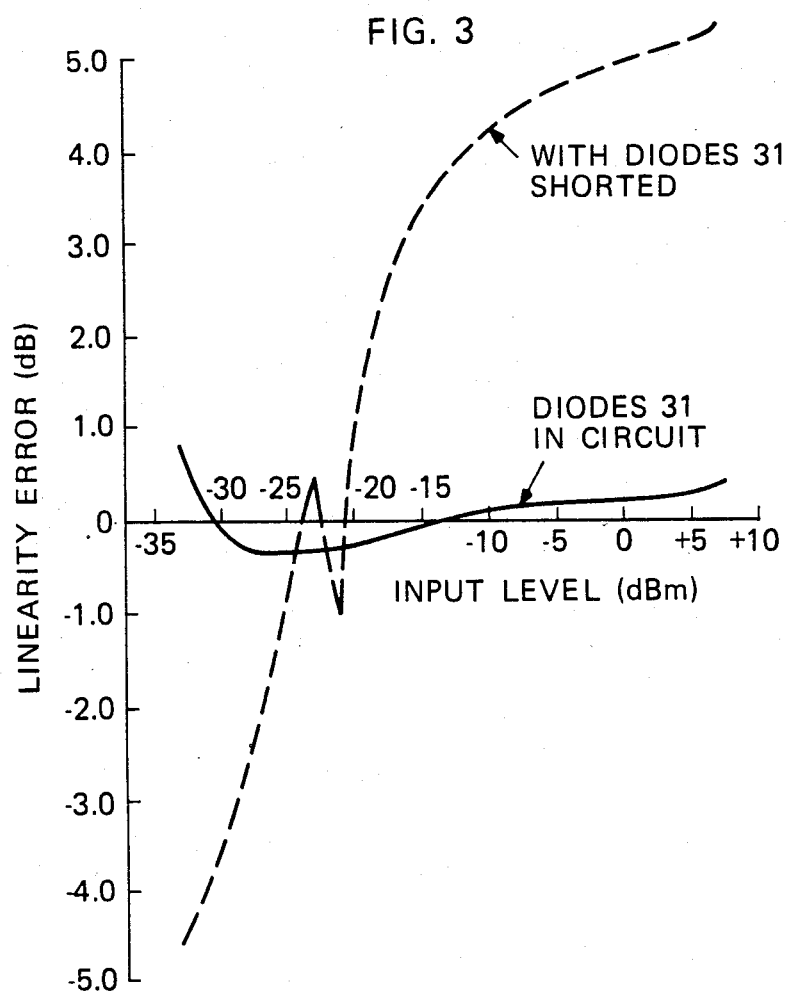
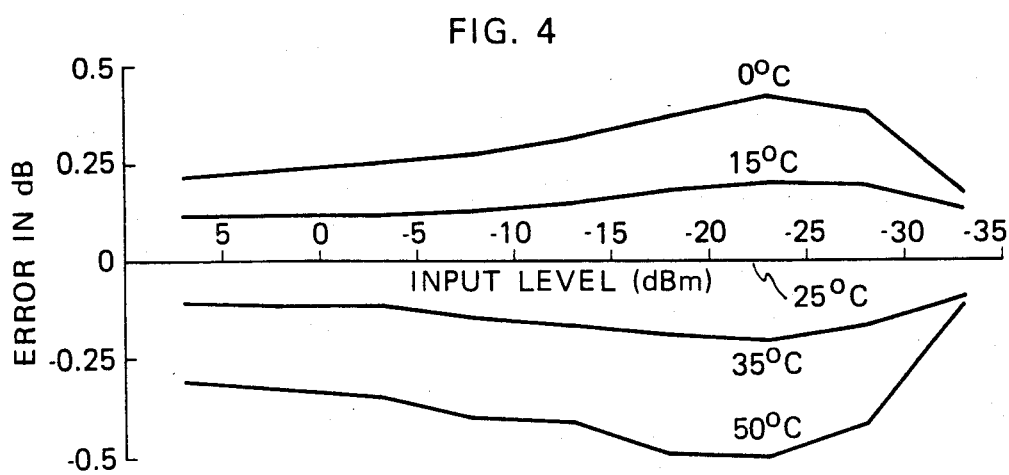

DIODE DETECTOR WITH LINEARITY COMPENSATING CIRCUIT

BACKGROUND OF THE INVENTION

This invention relates to linear detector circuits and more particularly to solid state diode detector circuits including means for compensating the nonlinearities of the diodes with variations in their operating temperature and signal input level.

In demanding applications such as video detectors for high performance radar systems, linearity of detector operation must be maximized over a broad range of operating temperature and input signal levels. For example, in some applications of this kind specifications may call for linearity of detector operation within a tolerance of half a decibel over a signal input range of thirty or forty decibels and over a temperature range of perhaps fifty degrees celsius. Efforts have previously been made to improve linearity of diode detectors employing a number of expedients, such as the provision of a prebiasing current source for the diodes which is helpful in linearizing their performance particularly for low-level inputs and low operating temperatures. Expedients such as these have been useful in improving detector linearity but it still is difficult to achieve the degree of linearity required for some applications without undue detector circuit complexity and cost. Further, even if linearity error is adequately corrected in a detector circuit as originally manufactured, it generally is difficult to restore the same error limits upon subsequent replacement of any failed detector diodes, without factory adjustment or realignment.

The present invention has as its principal objective the provision of a video linear detector affording a high degree of linearity under all operating conditions, achieving such operation with little added circuit complexity and cost, and enabling the maintenance of linearity error within tolerances after component replacement.

SUMMARY OF THE INVENTION

Briefly described, the present invention in its preferred embodiment as disclosed in this application comprises a number of semiconductor diodes preferably connected in bridge relation to provide full wave output from a pulsed or otherwise modulated carrier input, together with an operational amplifier having the bridge output as its input and providing a buffered output to the circuit load. This amplifier is enclosed within a feedback loop in which is interposed at least one diode matched to the detector diode or diodes. The feedback loop diode(s) introduce into the amplifier gain characteristic nonlinearities with temperature and signal level which are precisely complementary to those of the detector diode or diodes with these parameters, so that the output from the detector-amplifier combination is linear within acceptably narrow tolerances over a relatively wide range of operating temperature and input signal levels.

Depending on the number of diodes in the detector circuit and the value of gain to which the amplifier is set by selection of the value of the resistor included in its feedback loop, there may be either one or two diodes included in the feedback loop for maximized linearity of the overall detector-amplifier circuit, the number to be included being determined as hereinafter explained. Replacement of failed diodes with matched pairs of detector and feedback diodes enables continued maintenance of detector linearity within original tolerances without need for replacement or critical adjustment of other circuit components.

BRIEF DESCRIPTION OF THE DRAWINGS

The foregoing and other objects, features and advantages of the invention will be apparent from the ensuing detailed description when read in conjunction with the accompanying drawings, wherein:

FIG. 3 is a curve illustrating performance of the detector of FIG. 1 over a range of operating signal input levels;

FIG. 4 is a plot of detector nonlinearity as a function of temperature over an operating range.

DESCRIPTION OF THE PREFERRED EMBODIMENT

Figure 1:
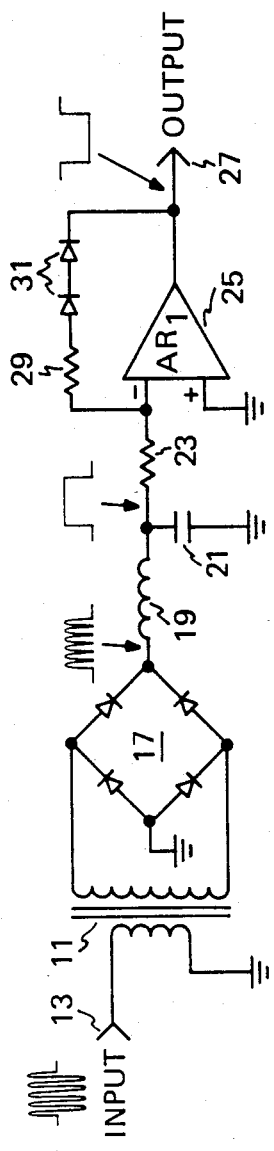
FIG. 1 is an elementary circuit diagram of a linear detector in accordance with the present invention.

With continued reference to the drawings, FIG. 1 illustrates the invention as embodied in a radar video detector circuit in which an input transformer 11 provides impedance matching between the RF input at terminal 13 and the higher impedance of the detector bridge 17, which comprises four solid state diodes poled as shown. An inductor 19 and capacitor 21 function as a low-pass filter which removes the RF frequency from the bridge output, and inductor 19 functions also to maintain a constant detected current during commutation of the diodes, all in conventional fashion.

The rectified and filtered output from bridge 17 is connected through resistance 23 to one (negative) input of an operational amplifier 25 the other (positive) input of which is connected to ground as shown. Operational amplifier 25 provides a buffered output to its load (not illustrated) through terminal 27, and is enclosed within a feedback loop which includes a resistor 29 and two diodes 31 connected in series relation with the resistor and with each other. These diodes 31 are of the same type as the detector diodes 17, and for ultimate linearity of circuit operation the detector and feedback loop diodes may be matched as to operating characteristics.

In operation of the circuit of FIG. 1, the feedback loop including diodes 31 introduces into the gain characteristic of the operational amplifier circuit a nonlinearity in gain which is complementary to the nonlinearity in output of the detector bridge and thus precisely compensates for the nonlinear impedance of the detector bridge as a function of RF signal input level and of ambient temperature. The manner in which this is achieved may perhaps best be understood by reference to FIG. 2, which is an approximate equivalent circuit showing the detection and rectification processes occurring in the circuit of FIG. 1.

Figure 2:
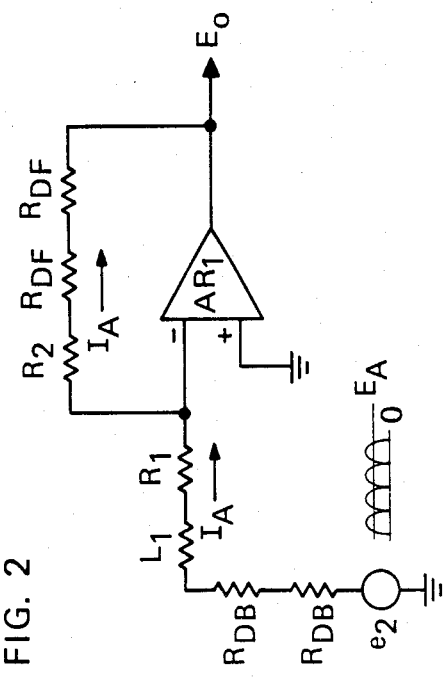
FIG. 2 represents the equivalent circuit of the detector of FIG. 1.

In FIG. 2, the input transformer and detector diodes have been replaced by an equivalent generator $e_2$ which produces as its output the same rectified AC voltage waveform as the detector diode bridge of FIG. 1. $E_A$ is the average value of rectified DC voltage output of the detector, and $I_A$ is the rectified DC output current of the detector. The value of $I_A$ is given by the relation:

$$IA = \frac{E_A + E_o}{R_{DB} + R_{DB} + R1 + R2 + R_{DF} + R_{DF}} \quad (1)$$

$$= \frac{E_A + E_o}{2R_{DB} + R1 + R2 + 2R_{DF}}$$

Where $R_{DB}$ is the resistance of each diode in the $I_A$ path through the detector bridge and $R_{DF}$ the resistance of the feedback diodes.

It is to be noted that although there are four diodes in the detector bridge of FIG. 1, only two of them are conducting at any given time, so only two of the equivalent diode resistances $R_{DB}$ are shown in circuit in FIG. 2. It should also be noted that since the inductor L1 as a high impedance to AC current but only negligible DC resistance, the current $I_A$ has no significant AC component at the frequencies of present concern.

According to operational amplifier theory, the output voltage $E_o$ of FIG. 2 is:

$$E_o = E_A \times \left[ -\frac{R2 + 2R_{DF}}{R1 + 2R_{DB}} \right] \quad (2)$$

If $R_2$ is made equal to $R_1$, and if the bridge and feedback diodes are matched so that the resistance $R_{DF}$ is equal to $R_{DB}$, then Equation 2 may be rewritten:

$$E_o = E_A \times \left[ -\frac{R1 + 2R_{DB}}{R1 + 2R_{DB}} \right] = -E_A \quad (3)$$

It will be noted that in Equation 3 the output $E_o$ is not a function of diode resistance, because all terms which contain the diode resistances $R_{DB}$ and $R_{DF}$ cancel out of the expression for gain. This assumes that the resistances of the feedback diodes remain at least approximately equal to those of the detector diodes over the operating ranges involved. The more closely the operating characteristics of the feedback and detector diodes can be thus matched, the smaller will be the errors in Equation 3 because, as is apparent from that equation, the diode resistances will more completely cancel out and variations in them be more fully compensated.

As indicated by Equation b3, the operational amplifier of FIG. 2 has a gain of $-1$. In some applications, it may be desirable to permit the dynamic linear range of the diode bridge detector circuit to be increased to a level such that the maximum detector output signal into the operational amplifier may become higher than the DC supply voltage to the amplifier. When this occurs with an amplifier having unity gain, the amplifier will limit or clip its output, thus introducing errors into the amplifier output. To avoid this the operational amplifier gain may conveniently be reduced, say from $-1$ to $-\frac{1}{2}$, simply by setting the value of the amplifier feedback resistor R2 equal to one-half the value of the input resistor R1, and removing one of the compensating diodes $R_{DF}$ from the feedback loop. When these changes are made, the amplifier output then is given by:

$$E_o = E_A \times \left[ -\frac{R1 + R_{DF}}{2R1 + 2R_{DB}} \right] = -\frac{1}{2} E_A \quad (4)$$

again assuming that the detector and feedback diodes have resistances $R_{DB}$ and $R_{DF}$ which are approximately equal over the desired operating range of temperature and signal level. From Equation 4 it will be apparent that the amplifier gain has been reduced to $-\frac{1}{2}$, and at the same time complete cancellation or compensation for signal level changes and temperature variations still is achieved, because the diode resistances $R_{DB}$ and $R_{DF}$ still will cancel from Equation 4 just as in Equation 3.

Referring now to FIG. 3, there are shown typical plots of linearity error or deviation from a straight line curve fit in a linear detector circuit like that of FIG. 1 as a function of input signal level in dBm, with the solid line curve depicting circuit performance with the feedback diodes 31 in circuit and the dotted line curve depicting performance of the same circuit with diodes 31 shorted out, thus causing the circuit to function in conventional manner. As will be apparent from comparison of the two curves in FIG. 3, the circuit with the feedback diode or diodes connected in accordance with the invention presents a very substantial improvement in linearity over the conventional detector circuit particularly at both extremes of the input signal range.

With reference now to FIG. 4, the performance of a linear detector circuit generally similar to that of FIG. 1 is shown over an operating temperature variation of 50° C. In FIG. 4, the displacement of circuit output voltage at all RF input levels is taken to be 0dB at 25° C. for reference purposes. The curves at the other temperatures indicated are drawn to show the linearity error (in dB) in the output voltage for each input signal level. Thus each temperature line on FIG. 4 indicates the dB by which the error curve is shifted from the reference as a result of the difference in temperature indicated. As will be apparent from FIG. 4, higher temperatures cause somewhat more substantial errors than do lower temperatures, but over the 50° C. temperature range represented in FIG. 4 linearity errors are held within acceptable tolerances and represent a substantial improvement over the performance generally attainable with prior art detector circuits.

It should be noted that the curves of FIGS. 3 and 4 were made using a continuous wave (cw) signal input rather than pulsed signals. With pulse signal inputs the addition of detector diode pre-bias as discussed hereinafter would desirably be added to the circuit to better preserve pulse rise times at low signal levels and low temperatures. It should also be noted that the circuit used in deriving the data plotted in FIGS. 3 and 4 included elements not shown in FIG. 1 because they are not part of the present invention. More specifically, the circuit included a preamplifier (like the preamp 37 shown in FIG. 5) which was known to introduce non-linearities of its own related to temperature. These were not separately measured so the plots could not be corrected for them, but it is believed that if such correction were made the performance of the detector circuit of the invention would be seen to be still better than as shown in FIG. 4.

Figure 5:
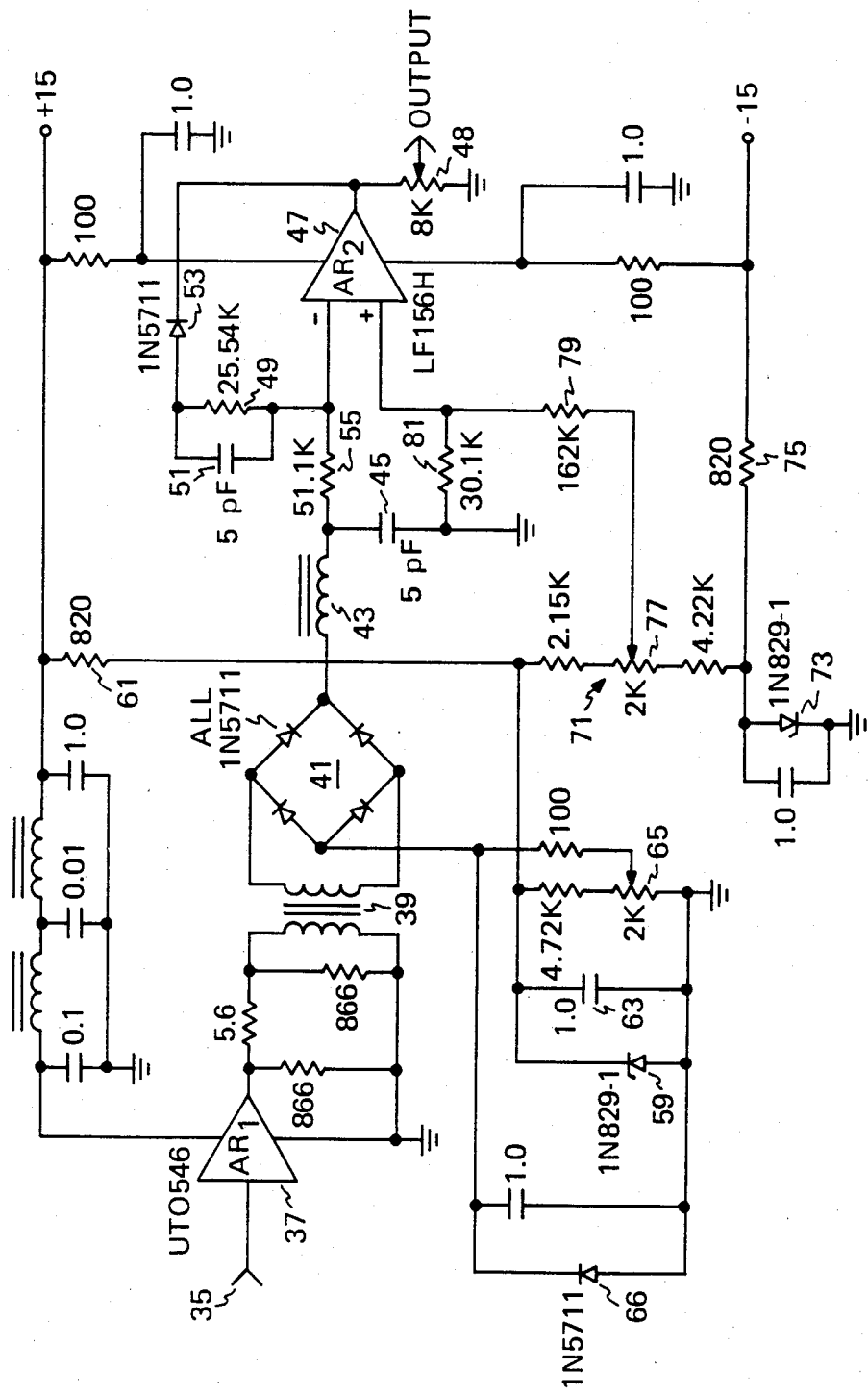
FIG. 5 is an elementary circuit diagram of a second embodiment of the invention incorporating detector diode pre-bias for further improving detector linearity.

With reference now to FIG. 5, a more fully detailed circuit diagram is shown including bridge detector pre-bias as previously mentioned. In FIG. 5, the input RF signal on terminal 35 is applied to a preamplifier 37 and coupled through transformer 39 to the diode detector bridge 41. The bridge output is low-pass filtered by inductor 43 and capacitor 45, and applied to the negative input of operational amplifier 47 as in the embodiment previously described. Amplifier 47 provides its output across a potentiometer 48, and includes a feedback loop comprising a resistor 49, by-pass capacitor 51, and a single diode 53 of the same type as used in the bridge 41 and preferably matched thereto.

It will be noted that only a single diode 53 is included in the amplifier feedback loop. As explained hereinabove, for complete compensation of the non-linearities introduced by each pair of the diodes 41 which are conducting at any given time, the amplifier feedback loop should include two diodes if the amplifier has unity gain, or, if the amplifier gain is reduced by half, only a single diode is required. To adjust the amplifier gain to the appropriate value, −0.5 in the embodiment of FIG. 5, resistor 49 is made precisely equal to one-half the resistance value of a resistor 55 interposed in the input to amplifier 47 as indicated and as previously explained.

For improved detector pulse response for low-level signals and low temperatures, means are provided for pre-biasing the detector diodes. These means comprise a constant voltage source including a zener diode 59 connected to the +15 volt supply through resistor 61 and by-passed by capacitor 63. A potentiometer 65 forming part of a voltage divider connected across the constant voltage source has its tap connected to bridge 41 between two of the detector diodes, causing a small current flow through all four of the diodes and also through the feedback loop diode 53. This slight conduction by the diodes lowers their impedance and thus improves the detector pulse response under the conditions just noted. For purposes of providing a low impedance ground return for diode bridge 41 without shorting out the pre-bias source, diodes 41 are connected to ground through the parallel combination of a capacitor and diode 66 poled as shown.

The bias current flow provided in the manner just explained, and the resulting positive voltage input to the inverting (negative) terminal of the operational amplifier 47, would tend to produce a negative offset voltage at the amplifier output terminal. To counteract this and produce zero voltage output from the operational amplifier when the detector input is zero, the non-inverting (positive) input terminal of the amplifier is connected to a source of bias voltage derived from the supply voltage sources by means of a voltage divider 71. Divider 71 comprises three resistors serially connected between the positive regulated voltage provided by zener diode 59 and a negative regulated voltage provided by a second zener 73 connected to the negative voltage supply through resistor 75. The center resistor 77 of voltage divider 71 is a potentiometer from which an adjustable bias voltage is applied across resistors 79 and 81, between which connection is made to the non-inverting (positive) input of the operational amplifier.

As will be apparent, with voltage divider resistances of the values shown in FIG. 5 the bias voltage thus applied across resistors 79–81 is positive, and by adjustment of potentiometer 77 may be made to generate a current through the resistors 79–81 such as to provide a bias voltage at the amplifier positive input just balancing that at the negative input attributable to the diode bias current flow, yielding zero voltage offset at the amplifier output. In setting up the bias circuitry just described the diode bias current control potentiometer 65 is first adjusted to provide a level of bias current flow through the detector diodes such as to optimize their response to pulse inputs, and the potentiometer 77 then is adjusted so as to cancel the offset of amplifier output voltage attributable to the diode bias current.

In the particular embodiment illustrated in FIG. 5, the components of the circuit shown had the component values indicated and the diodes were of the types also indicated. The RF bandwidth of the detector as shown was found to extend from 10 MHz to beyond the 110 MHz upper limit of the instrumentation used for test of the circuit, and the other performance parameters of the circuit were within the tolerances suggested above over the operating ranges there described.

While the invention has been particularly shown and described with reference to a presently preferred embodiment, those skilled in the art will understand that various changes may be made within the spirit and scope of the invention as hereinafter claimed.

What is claimed is:

1. A linear detector circuit comprising:
   (a) a detector bridge including an input terminal and paired semiconductor diodes connected to provide full wave rectified output from a modulated carrier input applied to said input terminal;
   (b) low pass filter means connected to the output of said detector bridge for removing carrier frequency components from said bridge output;
   (c) an operational amplifier connected to receive the signal passed by said filter and to provide a buffered output to a load; and
   (d) means for nonlinearizing the gain of said operational amplifier including a feedback loop around said amplifier containing at least one diode having operational characteristics matched to those of said bridge diodes, whereby the nonlinearity thus given the amplifier gain characteristics may compensate for nonlinearity in impedance of said detector bridge with variations in temperature and input signal level.

2. The linear detector circuit of claim 1 wherein the nominal value of said operational amplifier gain is adjusted to unity and the number of diodes in said feedback loop is two.

3. The linear detector circuit of claim 1 wherein the nominal value of said operational amplifier gain is adjusted to one-half and the number of diodes in said feedback loop is one.

4. The linear detector circuit of claim 1 further including means for causing a bias current flow through the diodes of said detector bridge and the at least one diode in said feedback loop, thereby enhancing detector linearity.

* * * * *